(12) United States Patent
Kim

(10) Patent No.: US 11,348,506 B1
(45) Date of Patent: May 31, 2022

(54) GATE CIRCUIT AND DISPLAY DEVICE

(71) Applicant: LG Display Co., Ltd., Seoul (KR)

(72) Inventor: JoonKi Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/386,348

(22) Filed: Jul. 27, 2021

(30) Foreign Application Priority Data

Dec. 1, 2020 (KR) .......................... 10-2020-0165745

(51) Int. Cl.
*G09G 3/20* (2006.01)
*H03K 17/687* (2006.01)

(52) U.S. Cl.
CPC ........... *G09G 3/20* (2013.01); *H03K 17/6871* (2013.01); *G09G 2300/0443* (2013.01); *G09G 2300/08* (2013.01); *G09G 2310/0267* (2013.01); *G09G 2310/08* (2013.01)

(58) Field of Classification Search
None
See application file for complete search history.

(56) References Cited

U.S. PATENT DOCUMENTS

2018/0335814 A1* 11/2018 Shao .......................... G06F 1/24
2021/0210154 A1* 7/2021 Feng ........................ G11C 19/28

* cited by examiner

*Primary Examiner* — Christopher J Kohlman
(74) *Attorney, Agent, or Firm* — Seed IP Law Group LLP

(57) ABSTRACT

Embodiments of the present disclosure are related to a gate circuit and a display device. By disposing a bootstrap capacitor between a Q1 node which is different from a Q node and an input terminal of a gate clock signal used for outputting a scan signal, a voltage level of the Q1 node can be maintained stably at an output timing of the scan signal. Thus, a driving state of a switching transistor which is controlled by the Q1 node and controls a QB node can be controlled stably, and thus a defect of refreshing of the QB node can be prevented and the scan signal can be output stably, thereby a reliability of the gate circuit can be improved.

22 Claims, 12 Drawing Sheets

FIG. 12

| Vth margin (ΔVth) | | CQ1 is not applied | | CQ1 is applied | |
|---|---|---|---|---|---|
| | | T2 | T1 | T2 | T1 |
| W/L Ratio | 0.8 | Δ10V(-7V ~ +3V) | Δ8V(-5V ~ +3V) | Δ12V(-8V ~ +4V) | Δ11V(-8V ~ +3V) |
| | 1.0 | Δ10V(-7V ~ +3V) | Δ9V(-6V ~ +3V) | Δ12V(-8V ~ +4V) | Δ11V(-8V ~ +3V) |
| | 1.5 | Δ11V(-8V ~ +3V) | Δ9V(-6V ~ +3V) | Δ12V(-8V ~ +4V) | Δ11V(-9V ~ +2V) |
| | 2.1 | Δ10V(-8V ~ +2V) | Δ9V(-6V ~ +3V) | Δ11V(-8V ~ +3V) | Δ11V(-9V ~ +2V) |

GATE CIRCUIT AND DISPLAY DEVICE

CROSS REFERENCE TO RELATED APPLICATION

This application claims priority from Korean Patent Application No. 10-2020-0165745, filed on Dec. 1, 2020, which is hereby incorporated by reference for all purposes as if fully set forth herein.

BACKGROUND

Technical Field

Embodiments of the present disclosure are related to a gate circuit and a display device.

Description of Related Art

The growth of the information society leads to increased demand for display devices to display images and use of various types of display devices, such as liquid crystal display devices, organic light emitting display devices, etc.

The display devices can comprise a display panel on which a plurality of gate lines, a plurality of data lines and a plurality of subpixels are disposed, and various driving circuits for driving the display panel. For example, the display devices can comprise a gate driving circuit to drive the plurality of gate lines, a data driving circuit to drive the plurality of data lines and a controller to control the gate driving circuit and the data driving circuit.

The gate driving circuit can supply a scan signal to the gate line at a predetermined timing, and can control a driving timing of the subpixel connected to the gate line.

The gate driving circuit can comprise various circuit elements for outputting the scan signal. The various circuit elements included in the gate driving circuit can be degenerated as a driving time increases, and an output defect of the scan signal can be occurred due to a degeneration of the circuit elements included in the gate driving circuit.

BRIEF SUMMARY

The inventors of the disclosure have appreciated that since the driving timing of the subpixel is controlled according to the scan signal supplied by the gate driving circuit, when the output defect of the scan signal occurs, a defect of an image displayed through the display panel can also occur.

Having in mind the one or more technical problems in the related art, the inventors of the disclosure have provided embodiments enhancing stability of outputting the scan signal of the gate driving circuit. The embodiments described herein also improves the reliability of scan signals of the gate driving circuit outputted to the display panel.

Further embodiments of the present disclosure provide methods that are capable of reducing a degeneration of a circuit element included in a gate driving circuit and enhancing a stability of outputting a scan signal of the gate driving circuit.

Embodiments of the present disclosure further provide methods that are capable of improving a reliability of the gate driving circuit by making the gate driving circuit to supply the scan signal stably even if the degeneration of the circuit element included in the gate driving circuit is occurred.

In an aspect, embodiments of the present disclosure provide a display device comprising, a display panel on which a plurality of gate lines, a plurality of data lines and a plurality of subpixels are disposed, and a plurality of gate circuits driving the plurality of gate lines, wherein each of the plurality of gate circuits comprising, a pull-up transistor to be controlled by a Q node and to be electrically coupled between an input terminal of a first gate clock signal and an output terminal of a scan signal, a pull-down transistor to be controlled by a QB node and to be electrically coupled between the output terminal of the scan signal and an input terminal of a first gate driving voltage, a first switching transistor to be controlled by a Q1 node electrically coupled to the Q node and to be electrically coupled between an input terminal of a second gate clock signal and the QB node, and a bootstrap capacitor which is electrically coupled between the Q1 node and the input terminal of the first gate clock signal.

In another aspect, embodiments of the present disclosure provide a gate circuit comprising, a pull-up transistor to be controlled by a Q node and to be electrically coupled between an input terminal of a first gate clock signal and an output terminal of a scan signal, a pull-down transistor to be controlled by a QB node and to be electrically coupled between the output terminal of the scan signal and an input terminal of a first gate driving voltage, a switching transistor to be controlled by a Q1 node electrically coupled to the Q node and to be electrically coupled between an input terminal of a second gate clock signal and the QB node, and a bootstrap capacitor which is electrically coupled between the Q1 node and the input terminal of the first gate clock signal.

In another aspect, embodiments of the present disclosure provide a gate circuit comprising, a pull-up transistor to be controlled by a Q node and to be electrically coupled between an input terminal of a first gate clock signal and an output terminal of a scan signal, a pull-down transistor to be controlled by a QB node and to be electrically coupled between the output terminal of the scan signal and an input terminal of a first gate driving voltage, a dummy transistor electrically coupled between the Q node and a Q1 node, a Q node capacitor electrically coupled between the Q node and the output terminal of the scan signal, and a bootstrap capacitor electrically coupled between the Q1 node and the input terminal of the first gate clock signal.

According to various embodiments of the present disclosure, as controlling a switching transistor for controlling a refresh of a QB node by a Q1 node which is different from a Q node, a degeneration of the switching transistor can be reduced.

According to various embodiments of the present disclosure, as arranging a bootstrap capacitor between the Q1 node and an input terminal of a gate clock signal, a driving stability of the switching transistor controlled by the Q1 node can be enhanced and a defect of refreshing of the QB node can be prevented, thus a reliability of the gate driving circuit can be improved.

BRIEF DESCRIPTION OF THE SEVERAL VIEWS OF THE DRAWINGS

The above and other benefits, features, and advantages of the present disclosure will be more clearly understood from the following detailed description, taken in conjunction with the accompanying drawings, in which:

FIG. 12 is a diagram illustrating an example of W/L of a switching transistor included in the gate circuit illustrated in FIG. 5.

DETAILED DESCRIPTION

Figure 1:
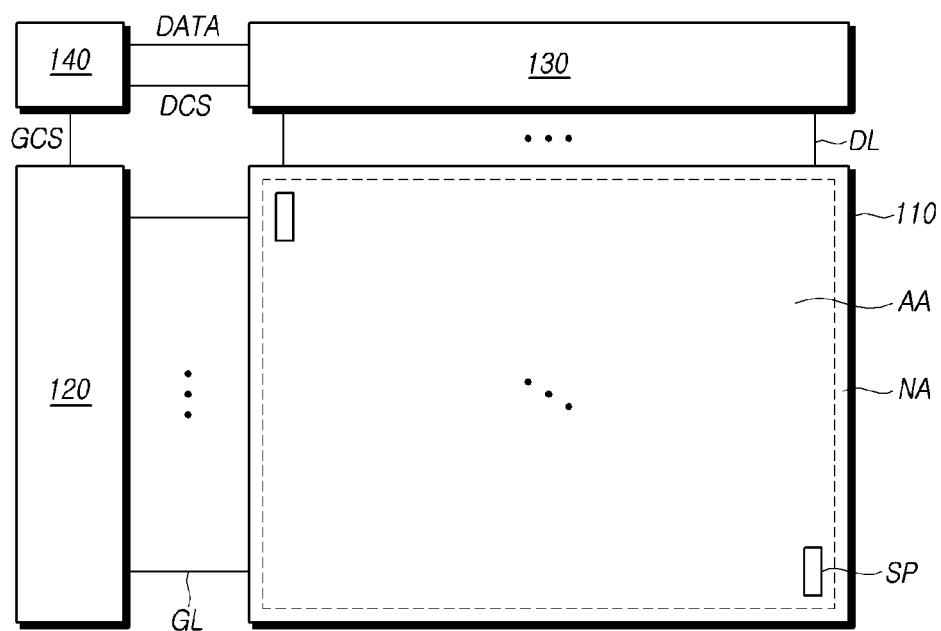
FIG. 1 is a diagram schematically illustrating a configuration included in a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "made up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

FIG. 1 is a diagram schematically illustrating a configuration included in a display device 100 according to embodiments of the present disclosure. All the components of the display device 100 according to all embodiments of the present disclosure are operatively coupled and configured.

Referring to FIG. 1, the display device 100 can comprise a display panel 110, and a gate driving circuit 120, a data driving circuit 130 and a controller 140 for driving the display panel 110.

The display panel 110 can comprise an active area AA where a plurality of subpixels SP is disposed, and a non-active area which is located outside the active area AA.

A plurality of gate lines GL and a plurality of data lines DL can be arranged on the display panel 110. The plurality of subpixels SP can be located in areas where the gate lines GL and the data lines DL overlap each other.

The gate driving circuit 120 is controlled by the controller 140, and sequentially outputs scan signals to the plurality of gate lines GL arranged on the display panel 110, thereby controlling the driving timing of the plurality of subpixels SP.

The gate driving circuit 120 can comprise one or more gate driver integrated circuits GDIC (not shown), and can be located only at one side of the display panel 110, or can be located at both sides thereof according to a driving method.

Each gate driver integrated circuit GDIC can be coupled to a bonding pad of the display panel 110 by a tape automated bonding TAB method or a chip-on-glass COG method, or can be implemented by a gate-in-panel GIP method to then be directly arranged on the display panel 110. In some cases, the gate driver integrated circuit GDIC can be integrated and arranged on the display panel 110. In addition, each gate driver integrated circuit GDIC can be implemented by a chip-on-film COF method in which an element is mounted on a film coupled to the display panel 110.

The data driving circuit 130 receives image data from the controller 140 and converts the image data into an analog data voltage Vdata. Then, the data driving circuit 130 outputs the data voltage Vdata to each data line DL according to the timing at which the scan signal is applied through the gate line GL so that each of the plurality of subpixels SP emits light having brightness according to the image data.

The data driving circuit 130 can comprise one or more source driver integrated circuits SDIC (not shown).

Each source driver integrated circuit SDIC can comprise a shift register, a latch circuit, a digital-to-analog converter, an output buffer, and the like.

Each source driver integrated circuit SDIC can be coupled to a bonding pad of the display panel 110 by a tape automated bonding TAB method or a chip-on-glass COG method, or can be directly disposed on the display panel 110. Alternatively, in some cases, the source driver integrated circuit SDIC can be integrated and arranged on the display panel 110. In addition, each source driver integrated circuit SDIC can be implemented by a chip-on-film COF method in which each source driver integrated circuit SDIC can be mounted on a film coupled to the display panel 110, and can be electrically coupled to the display panel 110 through wires on the film.

The controller 140 supplies various control signals to the gate driving circuit 120 and the data driving circuit 130, and controls the operation of the gate driving circuit 120 and the data driving circuit 130.

The controller 140 can be mounted on a printed circuit board, a flexible printed circuit, or the like, and can be electrically coupled to the gate driving circuit 120 and the data driving circuit 130 through the printed circuit board, the flexible printed circuit, or the like.

The controller 140 allows the gate driving circuit 120 to output a scan signal according to the timing implemented in each frame, and converts a data signal received from the outside to conform to the data signal format used in the data driving circuit 130 and then outputs the converted image data to the data driving circuit 130.

The controller 140 receives, from the outside (e.g., a host system), various timing signals including a vertical synchronization signal VSYNC, a horizontal synchronization signal HSYNC, an input data enable DE signal, a clock signal CLK, and the like, as well as the image data.

The controller 140 can generate various control signals using various timing signals received from the outside, and can output the control signals to the gate driving circuit 120 and the data driving circuit 130.

For example, in order to control the gate driving circuit 120, the controller 140 outputs various gate control signals GCS including a gate start pulse GSP, a gate shift clock GSC, a gate output enable signal GOE, or the like.

The gate start pulse GSP controls operation start timing of one or more gate driver integrated circuits GDIC constituting the gate driving circuit 120. The gate shift clock GSC, which is a clock signal commonly input to one or more gate driver integrated circuits GDIC, controls the shift timing of a scan signal. The gate output enable signal GOE specifies timing information on one or more gate driver integrated circuits GDIC.

In addition, in order to control the data driving circuit 130, the controller 140 outputs various data control signals DCS including a source start pulse SSP, a source sampling clock SSC, a source output enable signal SOE, or the like.

The source start pulse SSP controls a data sampling start timing of one or more source driver integrated circuits SDIC constituting the data driving circuit 130. The source sampling clock SSC is a clock signal for controlling the timing of sampling data in the respective source driver integrated circuits SDIC. The source output enable signal SOE controls the output timing of the data driving circuit 130.

The display device 100 can further comprise a power management integrated circuit for supplying various voltages or currents to the display panel 110, the gate driving circuit 120, the data driving circuit 130, and the like or controlling various voltages or currents to be supplied thereto.

Each of the plurality of subpixels SP can be an area defined by the overlapping locations of the gate line GL and the data line DL, and a liquid crystal or a light-emitting element can be disposed therein depending on the type of the display device 100.

For example, in the case that the display device 100 is a liquid crystal display device, the display panel 110 can comprise a liquid crystal layer. And by controlling an arrangement of a liquid crystal according to a field made by each of the plurality of subpixels SP, a brightness of the subpixel SP can be controlled and an image can be displayed.

For another example, in the case that the display device 100 is an organic light-emitting display device, an organic light-emitting diode OLED and various circuit elements can be disposed on the plurality of subpixels SP. As controlling a current supplied to the organic light-emitting diode OLED disposed on the subpixel SP by the various circuit elements, each subpixel SP can represent a brightness corresponding to an image data.

Alternatively, in some cases, a light-emitting diode LED or a micro light-emitting diode µLED can be disposed on the subpixel SP.

As described above, the display device 100 can control a driving timing of the subpixel SP according to a scan signal supplied by the gate driving circuit 120, and can display an image through the display panel 110.

The gate driving circuit 120 can output scan signals to the plurality of gate lines GL, and can comprise a plurality of gate circuits controlling each of the plurality of gate lines GL.

Figure 2:
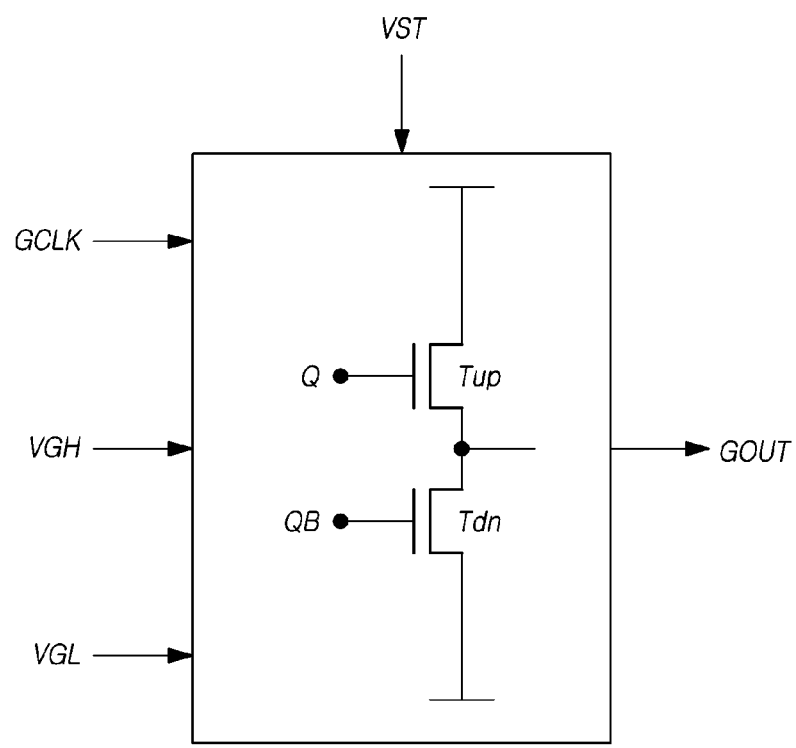
FIG. 2 is a diagram schematically illustrating a configuration of a gate circuit included in a gate driving circuit according to embodiments of the present disclosure.

FIG. 2 is a diagram schematically illustrating a configuration of a gate circuit included in the gate driving circuit 120 according to embodiments of the present disclosure.

Referring to FIG. 2, the gate circuit can comprise a pull-up transistor Tup controlled by a Q node, and a pull-down transistor Tdn controlled by a QB node. The pull-up transistor Tup can control an output of a scan signal of a turned-on level, and the pull-down transistor Tdn can control an output of a scan signal of a turned-off level.

The gate circuit can comprise a plurality of transistors and at least one capacitor for controlling a voltage level of the Q node and a voltage level of the QB node.

The gate circuit can receive various signals and voltages, and can output the scan signal according to an operation of the pull-up transistor Tup and the pull-down transistor Tdn.

For example, the gate circuit can receive a gate start signal VST and at least one gate clock signal GCLK for controlling a driving timing. The gate start signal VST can be a carry signal output from other gate circuit.

The gate circuit can receive one or more driving voltage, and can receive a first gate driving voltage VGH and a second gate driving voltage VGL. For example, the first gate driving voltage VGH can be a high potential driving voltage, and the second gate driving voltage VGL can be a low potential driving voltage.

The gate circuit can control the Q node and the QB node by various signals and voltages received, and can output the scan signal at a predetermined timing.

Circuit elements controlling the Q node and the QB node in the gate circuit can be constituted variously, and can be constituted for either reducing or minimizing a degeneration of the circuit elements according to the gate driving circuit.

Figure 3:
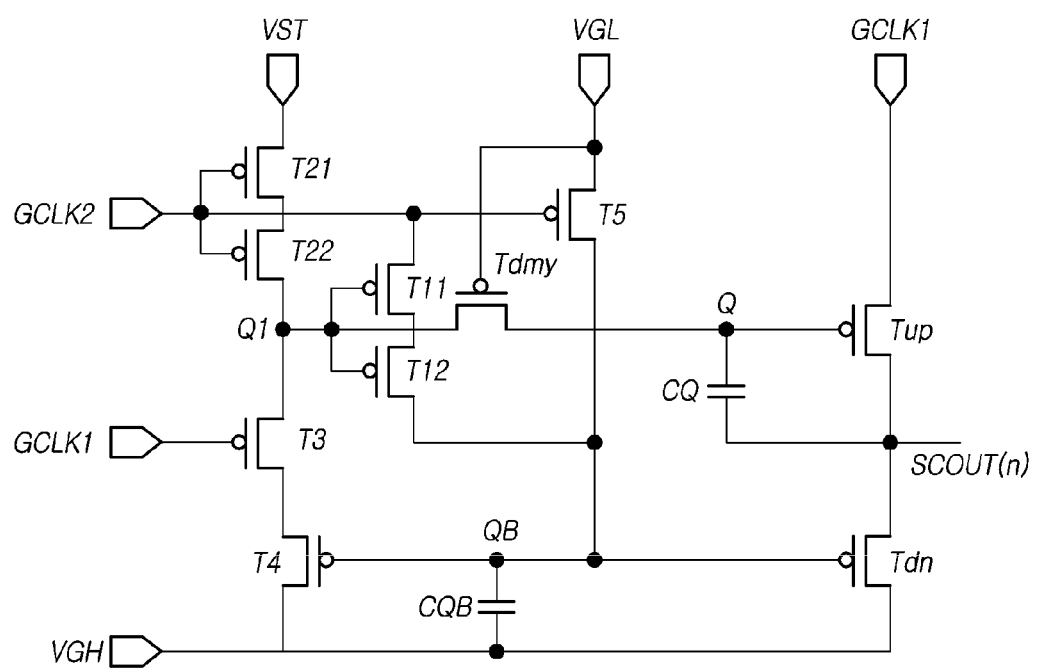
FIG. 3 is a diagram illustrating an example of a structure of a gate circuit according to embodiments of the present disclosure.

FIG. 3 is a diagram illustrating an example of a structure of the gate circuit according to embodiments of the present disclosure.

Referring to FIG. 3, the gate circuit can comprise a plurality of transistors Tup, Tdn, T11, T12, T21, T22, T3, T4, T5, Tdmy and at least one capacitor CQ, CQB.

FIG. 3 illustrates a case that each of the plurality of transistors included in the gate circuit is a P type as an example, in some cases, at least some of the plurality of transistors included in the gate circuit can be an N type. Furthermore, FIG. 3 illustrates a case that some transistors included in the gate circuit are disposed as dual transistors as an example, however, the plurality of transistors included in the gate circuit may be disposed as a single transistor or dual transistors.

The gate circuit can comprise the pull-up transistor Tup and the pull-down transistor Tdn controlling an output of the scan signal to the gate line GL.

The pull-up transistor Tup can be electrically coupled between an input terminal of a first gate clock signal GCLK1 and an output terminal SCOUT(n) of the scan signal. The pull-up transistor Tup can be controlled by the Q node.

The pull-down transistor Tdn can be electrically coupled between the output terminal SCOUT(n) of the scan signal and an input terminal of the first gate driving voltage VGH. The pull-down transistor Tdn can be controlled by the QB node.

The gate circuit can comprise various circuit elements for controlling the Q node and the QB node.

A first switching transistors T11, T12 can be electrically coupled between an input terminal of a second gate clock signal GCLK2 and the QB node. The first switching transistors T11, T12 can be controlled by a Q1 node.

The first switching transistors T11, T12 can be in a turned-on state, a turned-off state according to a voltage level of the Q1 node, and can control a voltage level of the QB node.

A second switching transistors T21, T22 can be electrically coupled between an input terminal of the gate start signal VST and the Q1 node. The second switching transistors T21, T22 can be controlled by the second gate clock signal GCLK2.

The second switching transistors T21, T22 can be in a turned-on state, or in a turned-off state according to the second gate clock signal GCLK2, and can control a voltage level of the Q1 node.

A third switching transistor T3 can be electrically coupled between the Q1 node and a fourth switching transistor T4. The third switching transistor T3 can be controlled by the first gate clock signal GCLK1.

The fourth switching transistor T4 can be electrically coupled between the third switching transistor T3 and the input terminal of the first gate driving voltage VGH. The fourth switching transistor T4 can be controlled by the QB node.

A fifth switching transistor T5 can be electrically coupled between an input terminal of the second gate driving voltage VGL and the QB node. The fifth switching transistor T5 can be controlled by the second gate clock signal GCLK2.

The gate circuit can comprise a Q node capacitor CQ which is electrically coupled between the Q node and the output terminal of the scan signal. The gate circuit can comprise a QB node capacitor CQB which is electrically coupled between the QB node and the input terminal of the first gate driving voltage VGH.

The gate circuit can further comprise a dummy transistor Tdmy other than above switching transistors.

The dummy transistor Tdmy can be electrically coupled between the Q node and the Q1 node. A gate node of the dummy transistor Tdmy can be electrically coupled to the input terminal of the second gate driving voltage VGL. The dummy transistor Tdmy can be controlled according to the second gate driving voltage VGL.

As the second gate driving voltage VGL which is a low potential driving voltage is supplied to the gate node of the dummy transistor Tdmy, the dummy transistor Tdmy can maintain a turned-on state during a driving period of the gate circuit.

The dummy transistor Tdmy can maintain a turned-on state during the driving period of the gate circuit, and can perform a function of a resistor between the Q node and the Q1 node.

When a voltage level of the Q node which makes a capacitance with the output terminal of the scan signal by the Q node capacitor CQ is changed at a timing that the scan signal is output, a degree that voltage level of the Q1 node is changed can be reduced by the dummy transistor Tdmy.

Thus, a stress applied to the first switching transistors T11, T12 due to a change of a voltage level of the Q1 node at a timing of outputting the scan signal can be reduced.

Figures 4A, 4B:
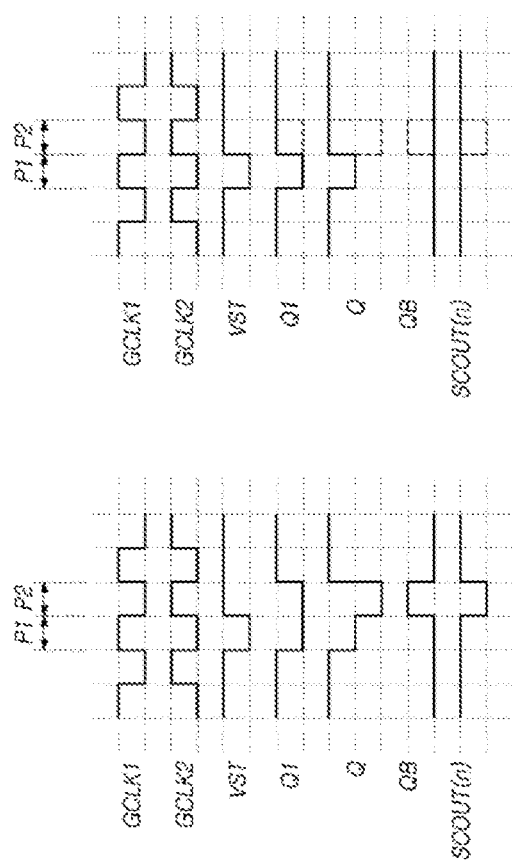
FIGS. 4A and 4B are diagrams illustrating examples of a driving waveform of the gate circuit illustrated in FIG. 3.

FIGS. 4A and 4B are diagrams illustrating examples of a driving waveform of the gate circuit illustrated in FIG. 3.

Referring to the first case as shown in FIG. 4A, the first gate clock signal GCLK1 and the second gate clock signal GCLK2 have different phases.

The gate start signal VST can be input as a low level in a first period P1.

Since the second gate clock signal GCLK2 is a low level in the first period P1, the second switching transistors T21, T22 can be in a turned-on state.

Since the second switching transistors T21, T22 become in a turned-on state, the gate start signal VST can be supplied to the Q1 node. The Q1 node can be a low level according to the gate start signal VST.

Since the dummy transistor Tdmy maintains a turned-on state during a driving period of the gate circuit, if the Q1 node becomes a low level, the Q node can also become a low level.

Since the Q1 node becomes a low level, the first switching transistors T11, T12 controlled by the Q1 node can be in a turned-on state.

Since the first switching transistors T11, T12 becomes in a turned-on state, the second gate clock signal GCLK2 can be supplied to the QB node. The QB node can be a low level according to the second gate clock signal GCLK2.

Since all of the Q node and the QB node are low levels in the first period P1, all of the pull-up transistor Tup and the pull-down transistor Tdn can be in a turned-on state.

In a second period P2, levels of the first gate clock signal GCKL1, the second gate clock signal GCLK2 and the gate start signal VST can be changed.

Since the second gate clock signal GCLK2 is a high level in the second period P2, the second switching transistors T21, T22 can be in a turned-off state.

Since the Q1 node and the Q node maintain a low level in the second period P2, the first switching transistors T11, T12 can maintain a turned-on state.

Since the first switching transistors T11, T12 maintain a turned-on state, the second gate clock signal GCLK2 can be supplied to the QB node. The QB node can become a high level according to the second gate clock signal GCLK2.

Since the Q node is a low level in the second period P2, the pull-up transistor Tup can maintain a turned-on state. Since the QB node is a high level in the second period P2, the pull-down transistor Tdn can be in a turned-off state.

Since the pull-up transistor Tup is in a turned-on state and the first gate clock signal GCLK1 is a low level in the second period P2, the scan signal of a low level can be output to the output terminal of the scan signal.

According to outputting of the scan signal of a low level, a voltage level of the Q node can be lowered more. Since the dummy transistor Tdmy is located between the Q1 node and the Q node, the Q1 node can maintain a previous voltage level even if a voltage level of the Q node become lower more.

Thus, it can be prevented that a stress is applied to the first switching transistors T11, T12 according to a change of a voltage level of the Q node when the scan signal of a low level is output.

As described above, by reducing a stress applied to the first switching transistors T11, T12, a degeneration of the first switching transistors T11, T12 can be prevented or delayed, but the degeneration of the first switching transistors T11, T12 can be occurred according to an increase of a driving time.

In this case, an operation controlling for the first switching transistors T11, T12 may not be performed normally due to a change of a threshold voltage of the first switching transistors T11, T12.

For example, such as an example illustrated in the second case as shown in FIG. 4B, the first switching transistors T11, T12 cannot maintain a turned-on state in the second period P2.

If the first switching transistors T11, T12 become in a turned-off state in the second period P2, the second gate clock signal GCLK2 of a high level cannot be supplied to the QB node, and the QB node can maintain a low level.

Since the QB node is a low level, the fourth switching transistor T4 and the pull-down transistor Tdn can maintain a turned-on state.

Since the third switching transistor T3 become in a turned-on state by the first gate clock signal GCLK1 of a low level in the second period P2, the first gate driving voltage VGH can be supplied to the Q node through the fourth switching transistor T4 and the third switching transistor T3.

The Q1 node and the Q node become a high level, the pull-up transistor Tup can be in a turned-off state.

Since the pull-up transistor Tup become in a turned-off state and the pull-down transistor Tdn is in a turned-on state, the scan signal of a high level can be output to the output terminal of the scan signal.

As the gate circuit cannot output the scan signal of a low level at a predetermined timing, a driving defect of the subpixel SP driven by the gate line GL coupled to the corresponding gate circuit can be occurred.

According to embodiments of the present disclosure, methods are provided that are capable of delaying a degeneration of the first switching transistors T11, T12 controlling the QB node, and outputting the scan signal stably even in a case that a degeneration of the first switching transistors T11, T12 due to an increase of a driving time of the gate circuit.

Figure 5:
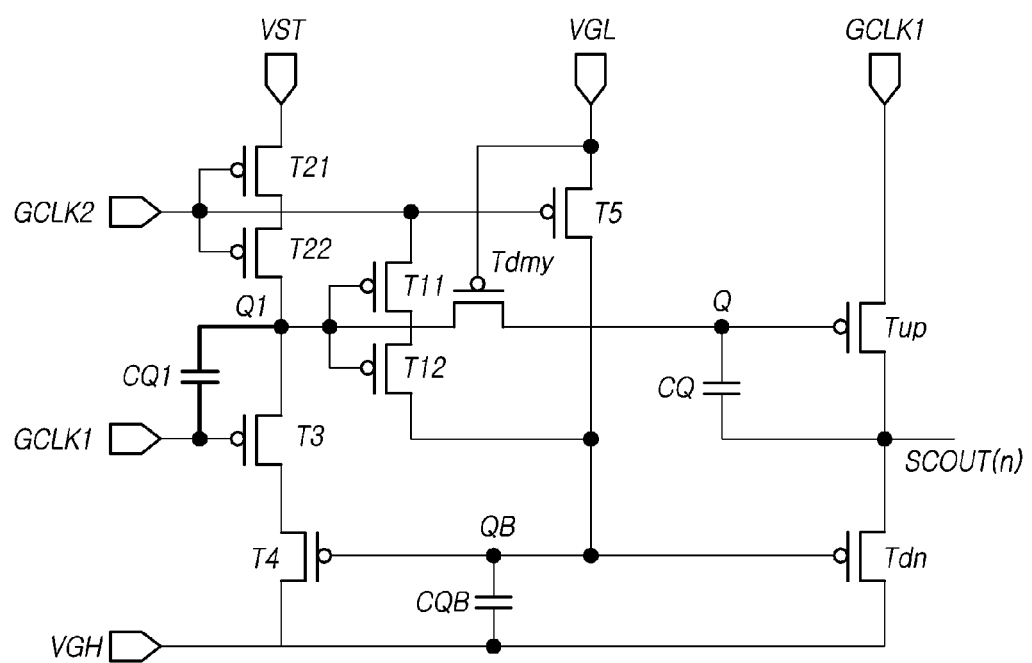
FIG. 5 is a diagram illustrating another example of a structure of a gate circuit according to embodiments of the present disclosure.

FIG. 5 is a diagram illustrating another example of a structure of the gate circuit according to embodiments of the present disclosure.

Referring to FIG. 5, the gate circuit can comprise the plurality of transistors Tup, Tdn, T11, T12, T21, T22, T3, T4, T5, Tdmy and at least one capacitor CQ, CQB, CQ1.

The gate circuit can comprise the pull-up transistor Tup, and the pull-down transistor Tdn controlling an output of the scan signal. A connecting structure and a driving method of the pull-up transistor Tup and the pull-down transistor Tdn can be same as those of the gate circuit described by FIG. 3.

The gate circuit can comprise the plurality of transistors T11, T12, T21, T22, T3, T4, T5, Tdmy controlling a voltage level of the Q node and a voltage level of the QB node. A connecting structure and a driving method of the plurality of transistors T11, T12, T21, T22, T3, T4, T5, Tdmy can be same as those of the gate circuit described by FIG. 3.

The gate circuit can comprise the Q node capacitor CQ which is electrically coupled between the Q node and the output terminal SCOUT(n) of the scan signal. The gate circuit can comprise the QB node capacitor CQB which is electrically coupled between the QB node and the input terminal of the first gate driving voltage VGH.

The gate circuit can comprise a Q1 node capacitor CQ1 which is electrically coupled between the Q1 node and the input terminal of the first gate clock signal GCLK1.

One end of the Q1 node capacitor CQ1 can be electrically coupled to the Q1 node.

Other end of the Q1 node capacitor CQ1 can be electrically coupled to the input terminal of the first gate clock signal GCLK1.

The input terminal of the first gate clock signal GCLK1 can mean an input terminal of the first gate clock signal GCLK1 which is electrically coupled to a gate node of the third switching transistor T3. Alternatively, the input terminal of the first gate clock signal GCLK1 can mean an input terminal of the first gate clock signal GCLK1 which is electrically coupled to the pull-up transistor Tup.

A line supplying the first gate clock signal GCLK1 to the third switching transistor T3 and a line supplying the first gate clock signal GCLK1 to the pull-up transistor Tup can be same, or different each other.

The Q1 node can make a capacitance with the input terminal of the first gate clock signal GCLK1 by the Q1 node capacitor CQ1. A voltage level of the Q1 node can be changed according to a level of the first gate clock signal GCLK1.

Thus, since the first gate clock signal GCLK1 of a low level is supplied at a timing that the scan signal of a low level is output, a voltage level of the Q1 node can maintain a low level.

Since a low level of the Q1 node is maintained by a bootstrap by the Q1 node capacitor CQ1, a turned-on state of the first switching transistors T11, T12 can be maintained.

Since a turned-on state of the first switching transistors T11, T12 is maintained, a supply of the second gate clock signal GCLK2 of a high level to the QB node can be performed normally.

Since a voltage of a high level is charged to the QB node normally, the fourth switching transistor T4 and the pull-down transistor Tdn can maintain a turned-off state.

Thus, levels of the Q1 node and the Q node can be maintained stably, the scan signal of a low level can be output through the output terminal of the scan signal normally.

A capacity of the Q1 node capacitor CQ1 can be configured as a capacity to be capable of controlling a voltage level of the Q1 node stably. The capacity of the Q1 node capacitor CQ1 can be same as or different from a capacity of the Q node capacitor CQ.

FIGS. 6 to 11 are diagrams illustrating an example of a driving scheme of the gate circuit illustrated in FIG. 5.

Figure 6:
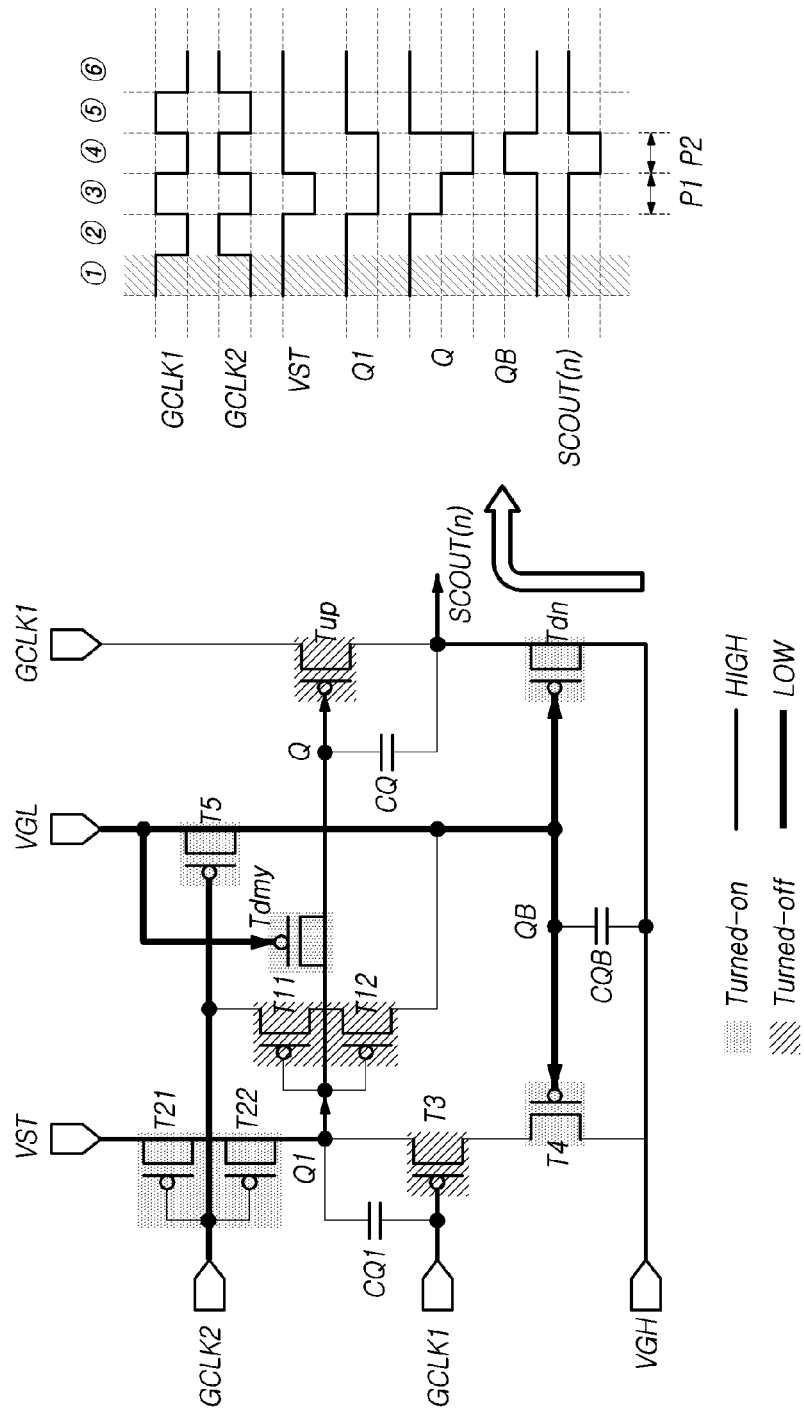
FIGS. 6 to 11 are diagrams illustrating an example of a driving scheme of the gate circuit illustrated in FIG. 5.

Referring to FIG. 6, in a period corresponding to ① in a driving timing diagram of the gate circuit, the first gate clock signal GCLK1 can be a high level, the second gate clock signal GCLK2 can be a low level, and the gate start signal VST can be a high level.

Since the first gate clock signal GCLK1 is a high level, the third switching transistor T3 can be in a turned-off state.

Since the second gate clock signal GCLK2 is a low level, the second switching transistors T21, T22 and the fifth switching transistor T5 can be in a turned-on state.

Since the second switching transistors T21, T22 are in a turned-on state, the gate start signal VST of a high level can be supplied to the Q1 node. Since the Q1 node is a high level, the first switching transistors T11, T12 can be in a turned-off state.

Since the dummy transistor Tdmy maintains a turned-on state by the second gate driving voltage VGL, the Q node can be a high level same as the Q1 node. Since the Q node is a high level, the pull-up transistor Tup can be in a turned-off state.

Since the fifth switching transistor T5 is in a turned-on state, the second gate driving voltage VGL can be supplied to the QB node.

Since the QB node is a low level, the fourth switching transistor T4 and the pull-down transistor Tdn can be in a turned-on state.

Since the pull-up transistor Tup become in a turned-off state and the pull-down transistor Tdn become in a turned-on state, the first gate driving voltage VGH can be output through the output terminal of the scan signal.

Figure 7:
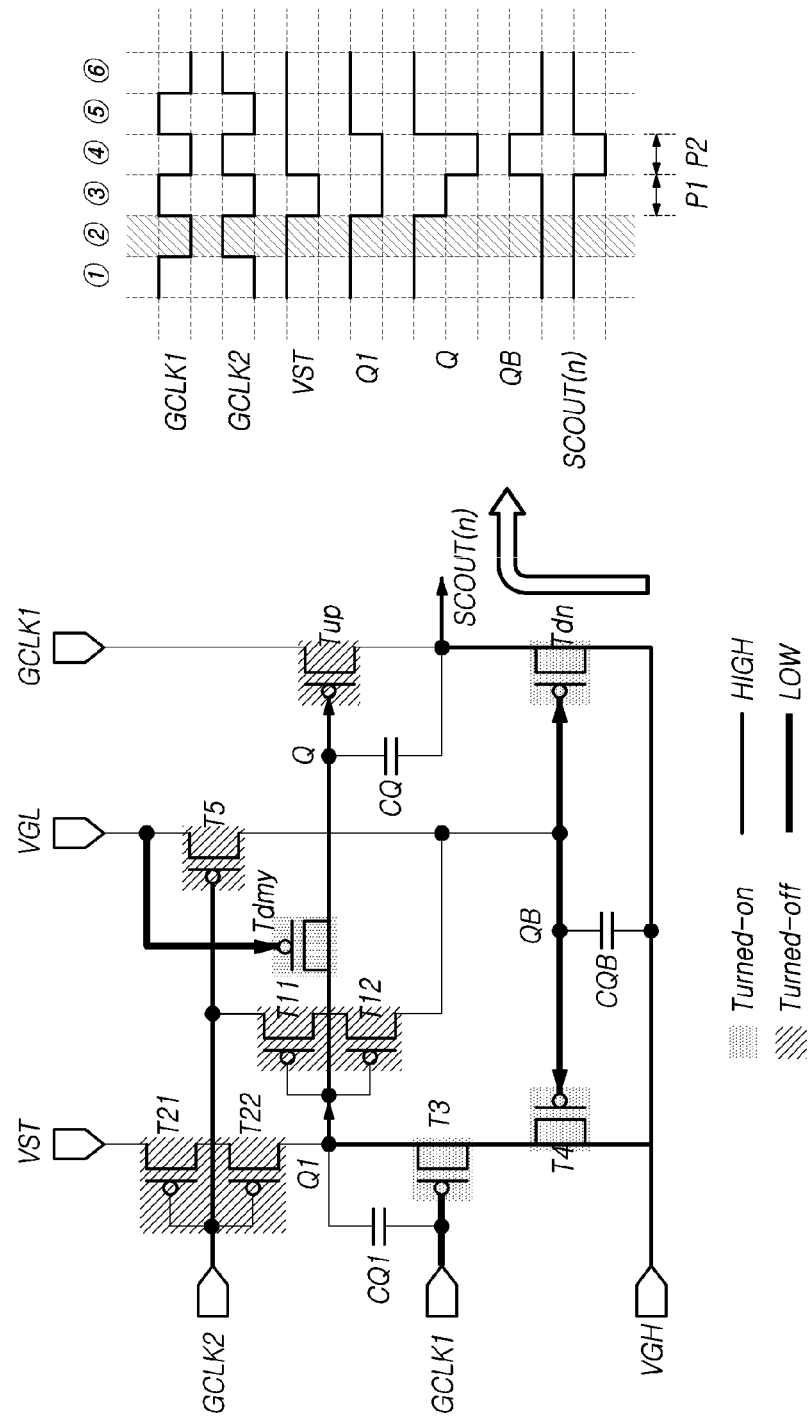

Referring to FIG. 7, in a period corresponding to ② in the driving timing diagram of the gate circuit, the first gate clock signal GCLK1 can be a low level, the second gate clock signal GCLK2 can be a high level, and the gate start signal VST can be a high level.

Since the first gate clock signal GCLK1 is a low level, the third switching transistor T3 can be in a turned-on state.

Since the second gate clock signal GCLK2 is a high level, the second switching transistors T21, T22 and the fifth switching transistor T5 can be in a turned-off state.

Since the third switching transistor T3 become in a turned-on state in a state that the fourth switching transistor T4 is turned-on, the first gate driving voltage VGH can be supplied to the Q1 node. Thus, the Q1 node and the Q node can maintain a high level.

Since the Q1 node is a high level, the first switching transistors T11, T12 can maintain a turned-off state.

Since the Q node maintains a high level and the QB node maintains a low level, the scan signal of a high level can be output through the pull-down transistor Tdn.

Figure 8:
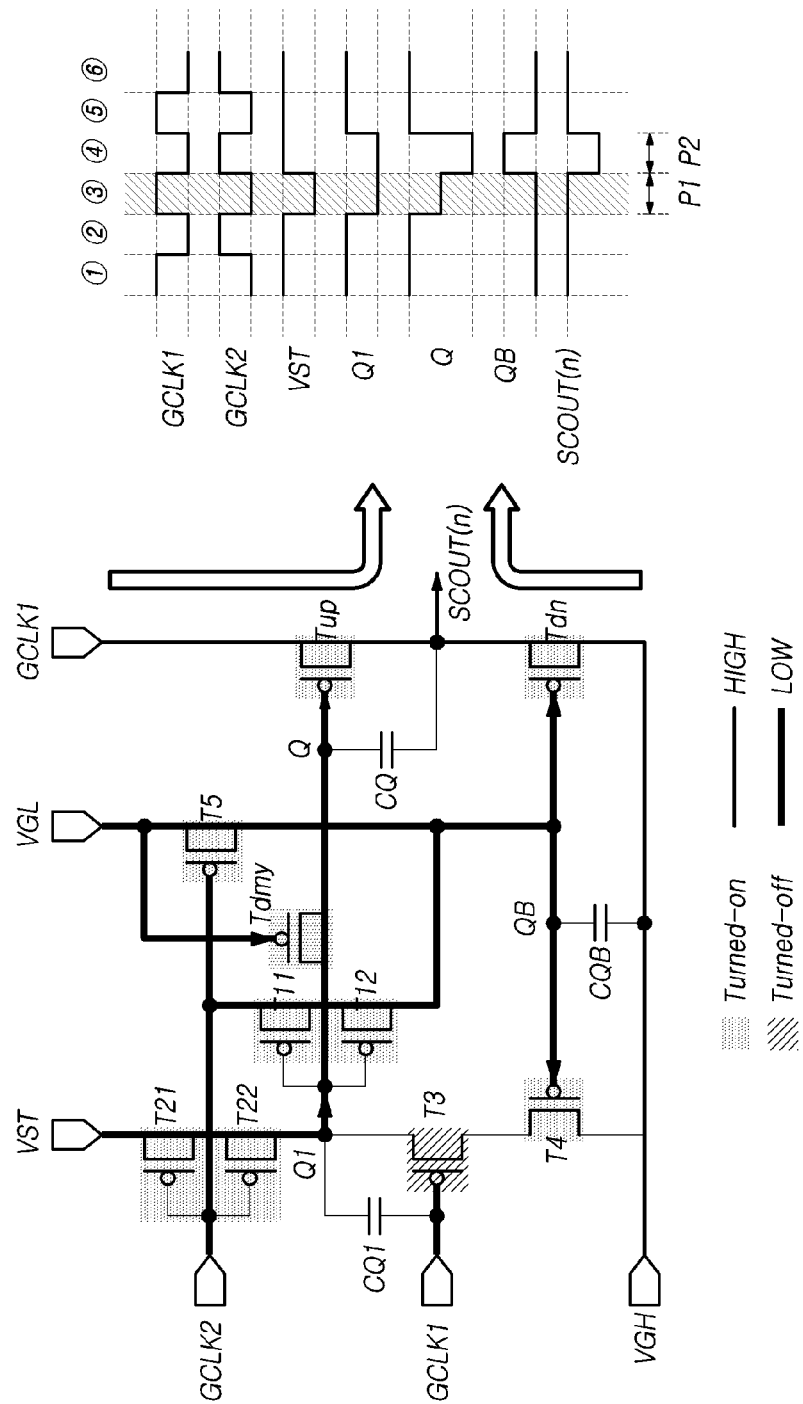

Referring to FIG. 8, in a period corresponding to ③ in a driving timing diagram of the gate circuit, the first gate clock signal GCLK1 can be a high level, the second gate clock signal GCLK2 can be a low level, and the gate start signal VST can be a low level.

Since the first gate clock signal GCLK1 is a high level, the third switching transistor T3 can be in a turned-off state.

Since the second gate clock signal GCLK2 is a low level, the second switching transistors T21, T22 and the fifth switching transistor T5 can be in a turned-on state.

Since the second switching transistors T21, T22 become in a turned-on state and the third switching transistor T3 become in a turned-off state, the gate start signal VST of a low level can be supplied to the Q1 node.

Since the dummy transistor Tdmy maintains a turned-on state, the Q node can be a low level same as the Q1 node.

Since the Q1 node is a low level, the first switching transistors T11, T12 can be in a turned-on state.

Since the first switching transistors T11, T12 become in a turned-on state, the second gate clock signal GCLK2 of a low level can be supplied to the QB node. Furthermore, since the fifth switching transistor T5 is in a turned-on state, the second gate driving voltage VGL of a low level can be supplied to the QB node.

Since all of the Q node and the QB node are low levels, all of the pull-up transistor Tup and the pull-down transistor Tdn can be in a turned-on state.

The first gate clock signal GCLK1 can be output through the pull-up transistor Tup and the first gate driving voltage VGH can be output through the pull-down transistor Tdn. Since all of the first gate clock signal GCLK1 and the first gate driving voltage VGH are high levels, the scan signal of a high level can be output.

Figure 9:
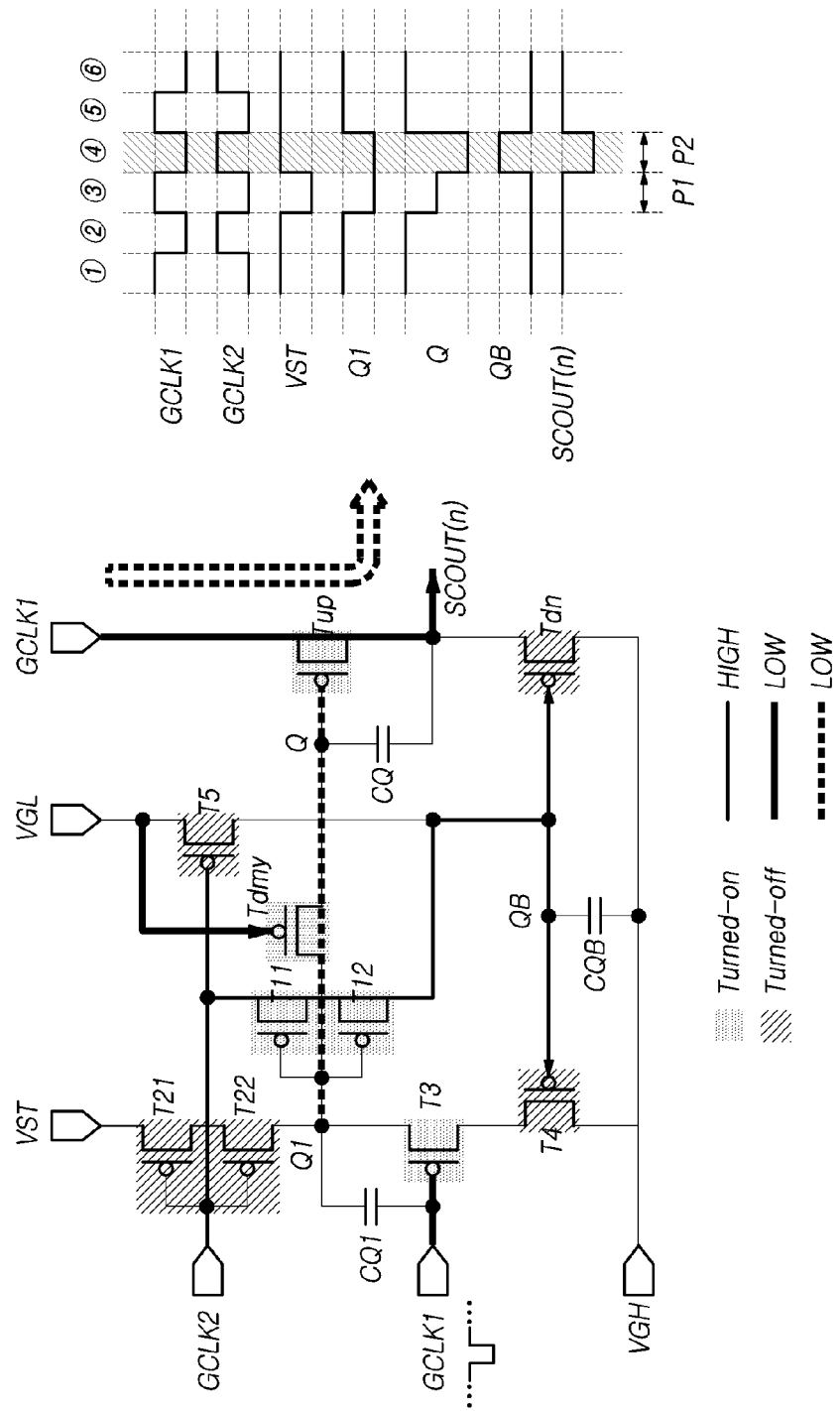

Referring to FIG. 9, in a period corresponding to ④ in the driving timing diagram of the gate circuit, the first gate clock signal GCLK1 can be a low level, the second gate clock signal GCLK2 can be a high level, and the gate start signal VST can be a high level.

Since the first gate clock signal GCLK1 is a low level, the third switching transistor T3 can be in a turned-on state.

Since the second gate clock signal GCLK2 is a high level, the second switching transistors T21, T22 and the fifth switching transistor T5 can be in a turned-off state.

Since the second switching transistors T21, T22 become in a turned-off state, the gate start signal VST may not be supplied to the Q1 node.

Thus, the Q1 node can maintain a low level. Since the Q1 node maintains a low level, the first switching transistors T11, T12 can maintain a turned-on state.

Since the first switching transistors T11, T12 maintain a turned-on state, the second gate clock signal GCLK2 of a high level can be supplied to the QB node.

Since the fifth switching transistor T5 is in a turned-off state, the second gate driving voltage VGL may not be supplied to the QB node.

Thus, the Q1 node and the Q node maintain a low level, the QB node can become a high level.

Furthermore, since the Q1 node capacitor CQ1 is arranged between the Q1 node and the input terminal of the first gate clock signal GCLK1, a low level of the Q1 node can be maintained stably.

Since the first gate clock signal GCLK1 is input as a low level in the corresponding period, a low level of the Q1 node which makes a capacitance with the input terminal of the first gate clock signal GCLK1 can be maintained stably.

By maintaining a low level of the Q1 node stably, a turned-on state of the first switching transistors T11, T12 can be maintained and refreshing of the QB node can be performed stably.

Since the QB node is a high level, the fourth switching transistor T4 and the pull-down transistor Tdn can be in a turned-off state.

Since the Q node is a low level, the pull-up transistor Tup can be in a turned-on state.

Since the pull-up transistor Tup is in a turned-on state, the first gate clock signal GCLK1 can be output through the output terminal of the scan signal.

Since the first gate clock signal GCLK1 is a low level, a level of the Q node can be lowered more according to outputting the first gate clock signal GCLK1 through the output terminal of the scan signal.

Since the dummy transistor Tdmy is located between the Q node and the Q1 node, a voltage level of the Q node and a voltage level of the Q1 node can be different each other in the corresponding period.

As described above, by arranging the Q1 node capacitor CQ1 between the Q1 node and the input terminal of the first gate clock signal GCLK1, a low level of the Q1 node can be maintained stably at a timing of outputting of the scan signal.

By maintaining a low level of the Q1 node stably, a turned-on state of the first switching transistor T11, T12 can be maintained stably.

Even in a case that a threshold voltage of the first switching transistors T11, T12 is changed due to a degeneration of the first switching transistors T11, T12, refreshing of the QB node can be performed stably and the scan signal can be output normally.

Figure 10:
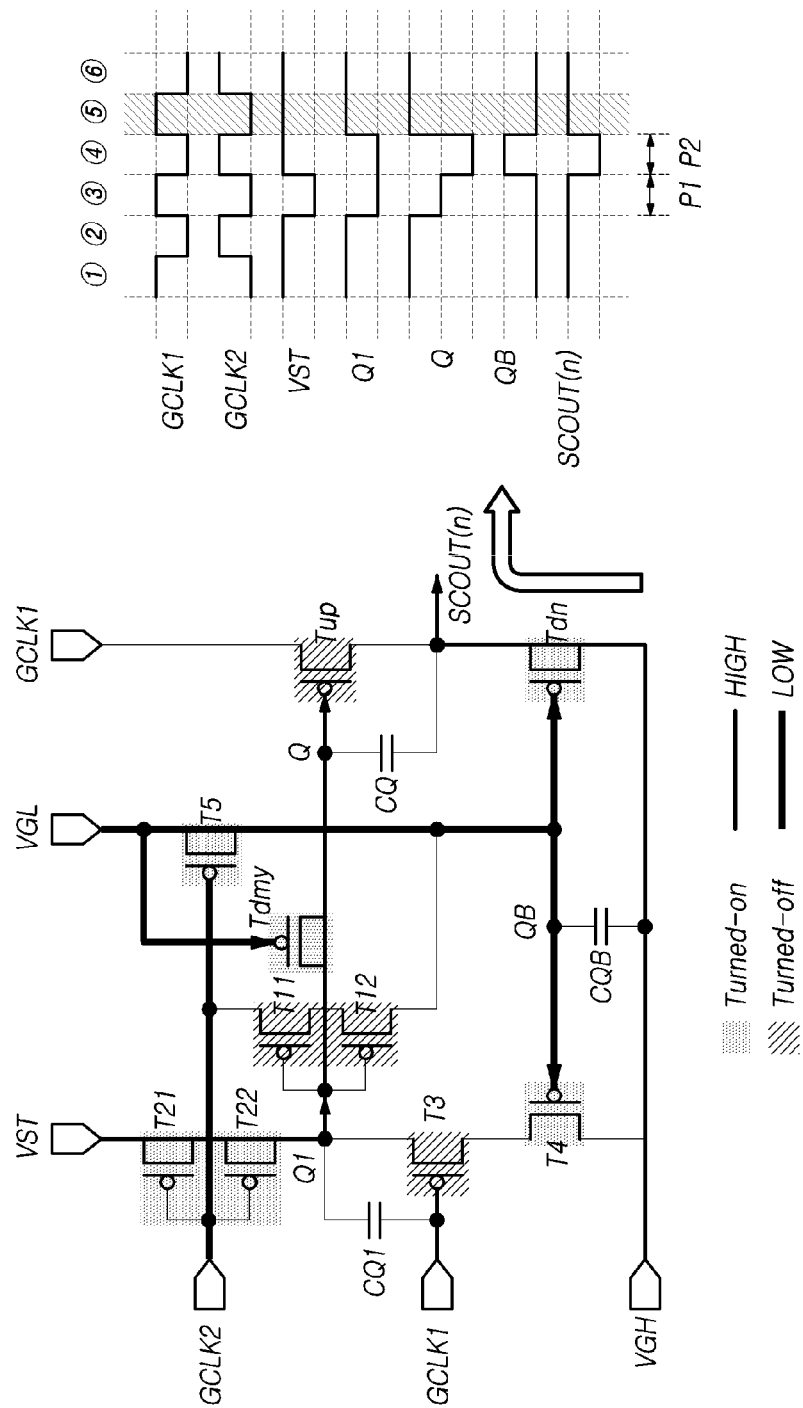

Referring to FIG. 10, in a period corresponding to ⑤ in the driving timing diagram of the gate circuit, the first gate clock signal GCLK1 can be a high level, the second gate clock signal GCLK2 can be a low level, and the gate start signal VST can be a high level.

The third switching transistor T3 can be in a turned-off state by the first gate clock signal GCLK1. The second switching transistors T21, T22 and the fifth switching transistor T5 can be in a turned-on state by the second gate clock signal GCLK2.

The Q1 node and the Q node can become a high level by the gate start signal VST of a high level.

The QB node can become a low level by the second gate driving voltage VGL of a low level.

The pull-up transistor Tup can become in a turned-off state since the Q node is a high level, and the pull-down transistor Tdn can become in a turned-on state since the QB node is a low level.

Thus, the first gate driving voltage VGH of a high level can be output to the output terminal of the scan signal through the pull-down transistor Tdn.

Figure 11:
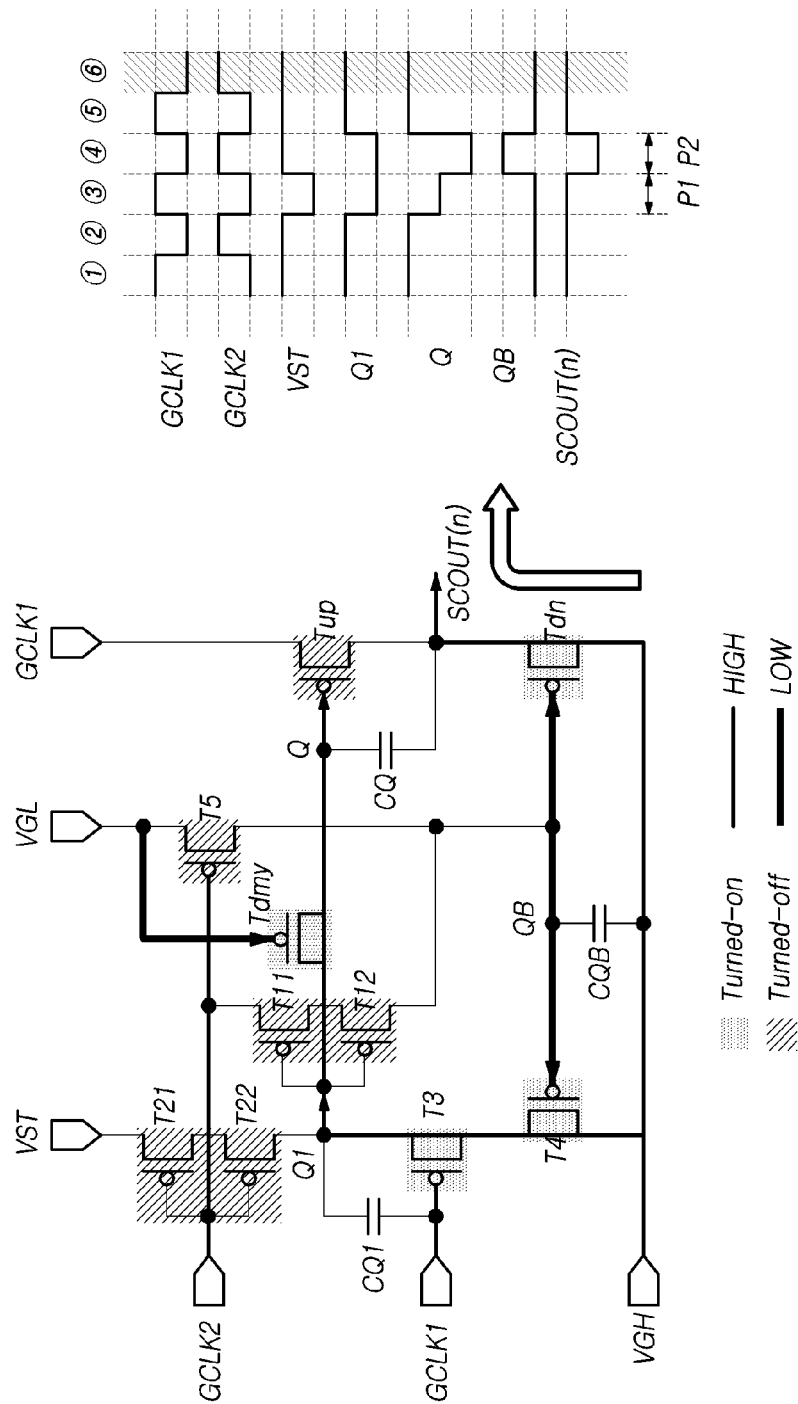

Referring to FIG. 11, in a period corresponding to ⑥ in the driving timing diagram of the gate circuit, the first gate clock signal GCLK1 can be a low level, the second gate clock signal GCLK2 can be a high level, and the gate start signal VST can be a high level.

The third switching transistor T3 can be in a turned-on state by the first gate clock signal GCLK1. The second switching transistors T21, T22 and the fifth switching transistor T5 can be in a turned-off state by the second gate clock signal GCLK2.

The Q1 node and the Q node can maintain a high level by the first gate driving voltage VGH supplied through the fourth switching transistor T4 and the third switching transistor T3.

Since the Q1 node is a high level, the first switching transistors T11, T12 can maintain a turned-off state. Thus, the QB node can be maintained as a low level.

Since the Q node maintains a high level and the QB node maintains a low level, a turned-off state of the pull-up transistor Tup and a turned-on state of the pull-down transistor Tdn can be maintained.

Thus, after the gate circuit outputs the scan signal of a low level, the scan signal of a high level can be maintained.

As described above, as the gate circuit maintains a voltage level of the Q1 node stably by the Q1 node capacitor CQ1 at a timing of outputting of the scan signal, the gate circuit can output the scan signal normally at a predetermined timing, and can maintain the scan signal of a turned-off level stably in a subsequent period.

Note that, although the gate circuit shown in FIGS. 5 to 11 includes a plurality of transistors T11, T12, T21, T22, T3, T4, T5, and Tdmy, in some embodiments, the gate circuit may only include a part of the transistors T11, T12, T21, T22, T3, T4, T5, and Tdmy. In addition, as can be understood by those skilled in the art, the arrangement of respective transistors is not limited to the specific examples shown in FIGS. 5 to 11.

Furthermore, while reducing a size of the switching transistor by arranging the Q1 node capacitor CQ1, an output margin according to a change of a threshold voltage of the switching transistor can be configured widely.

FIG. 12 is a diagram illustrating an example of W/L of a switching transistor included in the gate circuit illustrated in FIG. 5. The W/L ratio means a ratio of a width to a length of a channel region of the switching transistor.

Referring to FIG. 12, it represents the output margin according to the W/L ratio of the first switching transistor T1 and the W/L ratio of the second switching transistor T2 in cases that the Q1 node capacitor CQ1 is not applied and in cases that the Q1 node capacitor CQ1 is applied.

In the case that the Q1 node capacitor CQ1 is not applied to the gate circuit, it can be seen that the output margin of the second switching transistor T2 is the greatest as Δ11 V when the W/L ratio of the second switching transistor T2 is 1.5. It can be seen that the output margin of the first switching transistor T1 is the greatest as Δ9 V when the W/L ratio of the first switching transistor T1 is 1.5.

In the case that the Q1 node capacitor CQ1 is applied to the gate circuit, it can be seen that the output margins of the second switching transistor T2 and the first switching transistor T1 increase as compared with those in the case that the Q1 node capacitor CQ1 is not applied to the gate circuit at a same W/L ratio.

Furthermore, in the case that the Q1 node capacitor CQ1 is applied to the gate circuit, when the W/L ratio is configured as 0.8~1.0, it can be seen that the output margin of the first switching transistor T1 moves in (+) direction.

Thus, in a case that the Q1 node capacitor CQ1 is applied to the gate circuit, by configuring at least one of the W/L ratios of the first switching transistor T1 and the second switching transistor T2 as 0.8~1.0, the output margin of the corresponding switching transistor can be configured widely while reducing the size of the corresponding switching transistor.

According to embodiments of the present disclosure, as controlling a voltage level of the Q1 node and a voltage level of the Q node differently at an output timing of the scan signal by the dummy transistor Tdmy, a stress applied to the first switching transistors T11, T12 controlled by the Q1 node can be reduced.

Furthermore, by arranging the Q1 node capacitor CQ1 between the Q1 node and the input terminal of the first gate clock signal GCLK1 used for outputting the scan signal of the gate circuit, a voltage level of the Q1 node can be maintained stably at the output timing of the scan signal.

Accordingly, by stably controlling a driving state of the first switching transistors T11, T12 controlled by the Q1 node and performing refreshing of the QB node, the scan signal of a turned-on level can be output stably and a reliability of the gate circuit can be improved.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a display panel on which a plurality of gate lines, a plurality of data lines, and a plurality of subpixels are disposed; and
a plurality of gate circuits driving the plurality of gate lines,
wherein each of the plurality of gate circuits including:
a pull-up transistor to be controlled by a Q node and to be electrically coupled between an input terminal of a first gate clock signal and an output terminal of a scan signal;
a pull-down transistor to be controlled by a QB node and to be electrically coupled between the output terminal of the scan signal and an input terminal of a first gate driving voltage;
a first switching transistor to be controlled by a Q1 node electrically coupled to the Q node and to be electrically coupled between an input terminal of a second gate clock signal and the QB node; and
a bootstrap capacitor which is electrically coupled between the Q1 node and the input terminal of the first gate clock signal.

2. The display device of claim 1, wherein the each of the plurality of gate circuits further comprising:
a second switching transistor to be controlled by the second gate clock signal and to be electrically coupled between an input terminal of a gate start signal and the Q1 node.

3. The display device of claim 2, wherein the first switching transistor and the second switching transistor are in a turned-on state in a first period in which the gate start signal is a level to make the first switching transistor to be turned-on.

4. The display device of claim 3, wherein the pull-up transistor and the pull-down transistor are in a turned-on state in the first period.

5. The display device of claim 3, wherein the Q1 node and the Q node maintain levels to make the pull-up transistor to be turned-on in a second period after the first period.

6. The display device of claim 5, wherein the first gate clock signal is a turned-on level in the second period.

7. The display device of claim 5, wherein a voltage level of the Q1 node and a voltage level of the Q node are different each other in the second period.

8. The display device of claim 2, wherein at least one of a ratio of a width to a length of a channel region of the first switching transistor and a ratio of a width to a length of a channel region of the second switching transistor is equal to or greater than about 0.8 and equal to or less than about 1.

9. The display device of claim 2, wherein the each of the plurality of gate circuits further comprising:
a third switching transistor to be controlled by the first gate clock signal and to be electrically coupled to the Q1 node; and
a fourth switching transistor to be controlled by the QB node and to be electrically coupled between the third switching transistor and the input terminal of the first gate driving voltage.

10. The display device of claim 9, wherein the third switching transistor is in a turned-on state and the fourth switching transistor is in a turned-off state in a second period after a first period in which the gate start signal is a level to make the first switching transistor to be turned-on.

11. The display device of claim 9, wherein a gate node of the third switching transistor is electrically coupled to the bootstrap capacitor.

12. The display device of claim 1, wherein the each of the plurality of gate circuits further comprising:
a dummy transistor which is electrically coupled between the Q1 node and the Q node.

13. The display device of claim 12, wherein the dummy transistor is controlled by a second gate driving voltage.

14. The display device of claim 12, wherein the dummy transistor maintains a turned-on state in a period in which the gate circuit is driven.

15. A gate circuit, comprising:
a pull-up transistor to be controlled by a Q node and to be electrically coupled between an input terminal of a first gate clock signal and an output terminal of a scan signal;
a pull-down transistor to be controlled by a QB node and to be electrically coupled between the output terminal of the scan signal and an input terminal of a first gate driving voltage;
a switching transistor to be controlled by a Q1 node electrically coupled to the Q node and to be electrically coupled between an input terminal of a second gate clock signal and the QB node; and
a bootstrap capacitor which is electrically coupled between the Q1 node and the input terminal of the first gate clock signal.

16. The gate circuit of claim 15, wherein, in a first period, the switching transistor is turned-on, the Q node is a level to make the pull-up transistor to be turned-on, and the QB node is a level to make the pull-down transistor to be turned-on, and
in a second period after the first period, the switching transistor maintains a turned-on state, the Q node maintains the level to make the pull-up transistor to be turned-on, and the QB node is a level to make the pull-down transistor to be turned-off.

17. The gate circuit of claim 16, wherein a voltage level of the Q1 node and a voltage level of the Q node are different each other in the second period.

18. The gate circuit of claim 17, wherein, in the second period, the voltage level of the Q1 node is maintained or changed according to a voltage level of the first gate clock signal, and the voltage level of the Q node is changed according to a voltage level of the output terminal of the scan signal.

19. A gate circuit, comprising:
a pull-up transistor to be controlled by a Q node and to be electrically coupled between an input terminal of a first gate clock signal and an output terminal of a scan signal;

a pull-down transistor to be controlled by a QB node and to be electrically coupled between the output terminal of the scan signal and an input terminal of a first gate driving voltage;

a dummy transistor electrically coupled between the Q node and a Q1 node;

a Q node capacitor electrically coupled between the Q node and the output terminal of the scan signal; and a bootstrap capacitor electrically coupled between the Q1 node and the input terminal of the first gate clock signal.

20. The gate circuit of claim 19, wherein the dummy transistor maintains a turned-on state during a period in which at least one of the pull-up transistor and the pull-down transistor is in a turned-on state.

21. A display device, comprising a gate circuit according to claim 19, wherein the display device further comprises a display panel on which a plurality of gate lines, a plurality of data lines and a plurality of subpixels are disposed; and wherein the plurality of gate lines are driven by a plurality of the gate circuits.

22. The display device according to claim 21, wherein the gate circuit further comprises a first switching transistor to be controlled by the Q1 node and to be electrically coupled between an input terminal of a second gate clock signal and the QB node.

* * * * *